United States Patent

Marsh et al.

[11] Patent Number: 5,866,956
[45] Date of Patent: Feb. 2, 1999

[54] APPARATUS FOR AND METHOD OF MONITORING AND CONTROLLING A POWER SYSTEM

[75] Inventors: John K. Marsh, Wolcottville, Ind.; Robert Timmerman, Holland, Mich.

[73] Assignee: Dekko Engineering, Inc., Kendallville, Ind.

[21] Appl. No.: 839,073

[22] Filed: Apr. 23, 1997

Related U.S. Application Data

[63] Continuation of Ser. No. 470,336, Jun. 6, 1995, abandoned.

[51] Int. Cl.$^6$ .................................................. G01R 31/00
[52] U.S. Cl. ................. 307/31; 340/310.01; 340/310.02; 340/310.05; 340/310.06; 340/310.07; 340/825.04; 341/177; 324/157; 324/771
[58] Field of Search ........................ 307/31, 11; 332/106, 332/108, 149; 375/245; 340/825.04, 310.01, 505, 310.07, 310.05, 310.08, 310.02, 310.06; 329/313; 341/177; 324/771, 157

[56] References Cited

U.S. PATENT DOCUMENTS

| | | | |
|---|---|---|---|
| 4,058,678 | 11/1977 | Dunn et al. | 379/51 |
| 4,215,276 | 7/1980 | Janeway | 307/40 |
| 4,388,567 | 6/1983 | Yamazaki et al. | 315/291 |
| 4,401,943 | 8/1983 | Morris | 324/157 |
| 4,410,883 | 10/1983 | Swiston, Sr. | 340/538 |
| 4,433,326 | 2/1984 | Howell | 340/310.07 |
| 4,471,232 | 9/1984 | Peddie et al. | 307/35 |
| 4,540,890 | 9/1985 | Gangemi et al. | 307/40 |
| 4,556,864 | 12/1985 | Roy | 340/310.06 |
| 4,639,714 | 1/1987 | Crowe | 340/310 R |
| 4,644,320 | 2/1987 | Carr et al. | 340/310.06 |
| 4,737,769 | 4/1988 | Masot | 340/533 |
| 4,741,023 | 4/1988 | Lawson | 324/771 |
| 4,766,414 | 8/1988 | Shuey | 340/310.05 |
| 4,780,910 | 10/1988 | Huddleston et al. | 340/825.04 |
| 4,804,938 | 2/1989 | Rouse et al. | 340/310.06 |
| 5,051,720 | 9/1991 | Kittirutsunetorn . | |
| 5,055,746 | 10/1991 | Hu et al. . | |
| 5,089,974 | 2/1992 | Demeyer et al. . | |
| 5,117,122 | 5/1992 | Hogarth et al. . | |
| 5,128,677 | 7/1992 | Donovan et al. | 341/177 |
| 5,157,273 | 10/1992 | Medendorp et al. . | |
| 5,164,609 | 11/1992 | Poppe et al. . | |

OTHER PUBLICATIONS

EIA Interim Standard for EIA Home Automation Syste (CEBus), dated Oct. 1992, Index and pp. 1–6.

*Primary Examiner*—William M. Shoop, Jr.
*Assistant Examiner*—Albert W. Paladini
*Attorney, Agent, or Firm*—Barnes & Thornburg

[57] ABSTRACT

A apparatus for monitoring and controlling a power system having an alternating current bus. The apparatus includes a module which is coupled to the bus and which digitizes and modulates at least one of a voltage waveform and a current waveform present on the bus. A control unit which is also coupled to the bus demodulates the digitized waveform and calculates a parameter selected from the group consisting of average current, root mean square current, peak current, current crest factor, average voltage, root mean square voltage, peak voltage, voltage crest factor, voltage surge, current waveform shape, voltage waveform shape, current waveform harmonic structure, voltage waveform harmonic structure and combinations thereof. The calculated parameter is used to monitor conditions on the bus and control loads connected to modules of the system.

28 Claims, 8 Drawing Sheets

DATA

| | |
|---|---|
| AVERAGE VOLTAGE | 120 |
| RMS VOLTAGE | 123 |
| PEAK VOLTAGE | 170 |
| AVERAGE CURRENT | 1.00 |
| RMS CURRENT | 1.23 |
| PEAK CURRENT | 3.50 |
| CREST FACTOR | 3.50 |
| POWER FACTOR | .855 |
| PEAK POWER | 250 |
| AVERAGE POWER | 95.0 |
| VA | 130 |
| CBEMA K FACTOR | 3.75 |

CURSOR

| | | |
|---|---|---|
| VOLTAGE | | 123 |
| CURRENT | | 1.23 |
| HARMONIC VOLTAGE | % | 12.3 |
| HARMONIC CURRENT | % | 1.23 |

STATUS

☐ CONTROL     ☐ ALARM

☐ CONTROLER  ☐ OFF

FIG. 4C

|  | VOLTAGE (V) | CURRENT (A) |
|---|---|---|
| SAMPLE-1 | 1.88 | 0.05 |
| RMS | 113.12 | 1.60 |
| PEAK | 160.00 | 3.76 |
| CF | 1.41 | 2.36 |
|  | POWER | |
| APPARENT | 180.47 VA | |
| AVERAGE | 132.18 W | |
| PEAK | 551.42 W | |
| PF | 0.732 | |
| WATTHOURS | XXX | |

| HARMONIC: 1 | VOLTAGE | CURRENT |
|---|---|---|
| MAGNITUDE | 100.00% | 100.00% |
| PHASE | 273.34 | 5.73 |
| THD | 4.16% | 88.30% |

| | N-TO-G VOLTAGE |
|---|---|
| RMS | 0.33 |
| RMS | 1.25 |

APPARATUS FOR AND METHOD OF MONITORING AND CONTROLLING A POWER SYSTEM

This is a Continuation of application Ser. No. 08/470,336, filed Jun. 6, 1995 now abandoned.

BACKGROUND AND SUMMARY OF THE INVENTION

The present invention relates to an apparatus and method of monitoring and controlling a power system having an alternating current bus.

Devices that monitor and/or control various electrical parameters, such as voltage, current, and power utilized by one or more loads connected to an alternating current bus of a power system are known. These devices can be used to determine such things as inefficient uses of electricity and detect problems on the alternating current bus. Such devices may also be used to manage loads connected to the bus by controlling these parameters. Such control can help reduce or eliminate inefficiencies and prevent damage to the alternating current bus. Such control can also help actuate the one or more loads as desired.

The present invention is an improvement over these devices. An embodiment of the present invention includes a monitoring and control apparatus for a power system having an alternating current bus which includes at least one line, a neutral, and a ground. The apparatus includes a module coupled to the bus for digitizing either or both a voltage waveform or a current waveform, both of which may appear on the bus. The voltage and current waveforms may be sinusoidal, with a frequency of approximately 60 Hz. The module may also modulate the digitized waveform onto a carrier. The apparatus also includes a control unit that is coupled to the bus which demodulates the digitized waveform and calculates at least one of the following: average current, root mean square current, peak current, current crest factor, average voltage, root mean square voltage, peak voltage, voltage crest factor, voltage surge, current waveform shape, voltage waveform shape, current waveform harmonic structure, and voltage waveform harmonic structure.

The apparatus may further include a second module coupled to the bus that is responsive to a predetermined condition at the first module. The first module may be programmed by the control unit to sense a condition at that module and direct the second module to respond as a result of that condition. The control unit may be configured to control at least one of the following: the power supplied to a load at one or more of the modules, activation/deactivation of one or more of the modules, digitization of the voltage waveform, the current waveform, or both the voltage and current waveforms on the bus at one or more of the modules, and transmission of the digitized waveform to the control unit. The modules may each include a transceiver and the control unit may also include a transceiver, each of which are configured to transmit and receive radio frequency signals. A load may be coupled to each module and the module configurable to control a load voltage, a load current, or both the load voltage and the load current.

The module may rectify the voltage waveform, the current waveform, or both the voltage and current waveforms before digitizing the waveform. This rectification may be of full cycle of the waveform.

In one or more embodiments of the apparatus, the control unit may be a computer. Additionally, in one or more embodiments of the apparatus, the module and control unit may each include transceivers, that are configured to transmit and receive radio frequency signals. Furthermore, the module may be coupled to a load and configurable to control a load voltage, a load current, or both the load voltage and the load current.

An embodiment of apparatus constructed in accordance with the present invention may further include a second module coupled to a second alternating current bus which includes at least one line, a neutral, and a ground. The second module digitizes a second voltage waveform, a second current waveform, or both the second voltage waveform and the second current waveform on the second bus. Subsequent to digitizing, the second module modulates the digitized waveform onto a second carrier. This embodiment may include a second control unit that demodulates the digitized waveform of the second module and calculates at least one of the values that may be calculated by the first control unit. In this embodiment, the control units may be in communication with one another whereby one or more waveforms digitized by the second module are received by either control unit. At least one of the control units may be configured to control at least one of the following: the power supplied to a load at each of the modules, activation/deactivation of the modules, digitization of at least one of the first voltage waveform and the first current waveform by the first module, digitization of at least one of the second voltage waveform and the second current waveform by the second module, and transmission of the digitized waveforms to the control unit.

The present invention also is directed to a method of monitoring and controlling a power system having an alternating current bus which includes at least one line, a neutral, and a ground. The method includes the steps of rectifying a voltage waveform, a current waveform, or both the voltage and current waveforms which may appear on the bus. The method also includes the steps of digitizing the rectified waveform and transmitting the digitized waveform to a control unit. The method additionally includes the step of calculating at least one of the following: average current, root mean square current, peak current, current crest factor, average voltage, root mean square voltage, peak voltage, voltage crest factor, voltage surge, current waveform shape, voltage waveform shape, current waveform harmonic structure, and voltage waveform harmonic structure.

The method may also include the steps of programming a first module coupled to the bus to sense a predetermined condition at the first module and controlling a second module coupled to the bus in response to the predetermined condition at the first module. The method may additionally include the step of activating a module coupled to the bus to control at least one of the following: the power supplied to a load at one or more modules coupled to the bus, activation/deactivation of one or more of the modules, digitization of the voltage waveforms, the current waveforms, or both waveforms, and transmission to the control unit.

The method may further include the step of displaying the calculation. Also, the transmitting step may include the steps of modulating the digitized waveform onto a carrier and demodulating the digitized waveform at the control unit.

The method may additionally include the steps of programming a module coupled to the bus to sense a predetermined condition at the first module and controlling the module in response to the predetermined condition. Furthermore, the method may include the step of programming each module coupled to the bus to have an identifier that allows each module and the control unit to recognize each module coupled to the bus.

Other objects, advantages and novel features of the present invention will become apparent from the following detailed description of the invention when considered in conjunction with the accompanying drawings.

DETAILED DESCRIPTION OF THE DRAWINGS

Figure 1:
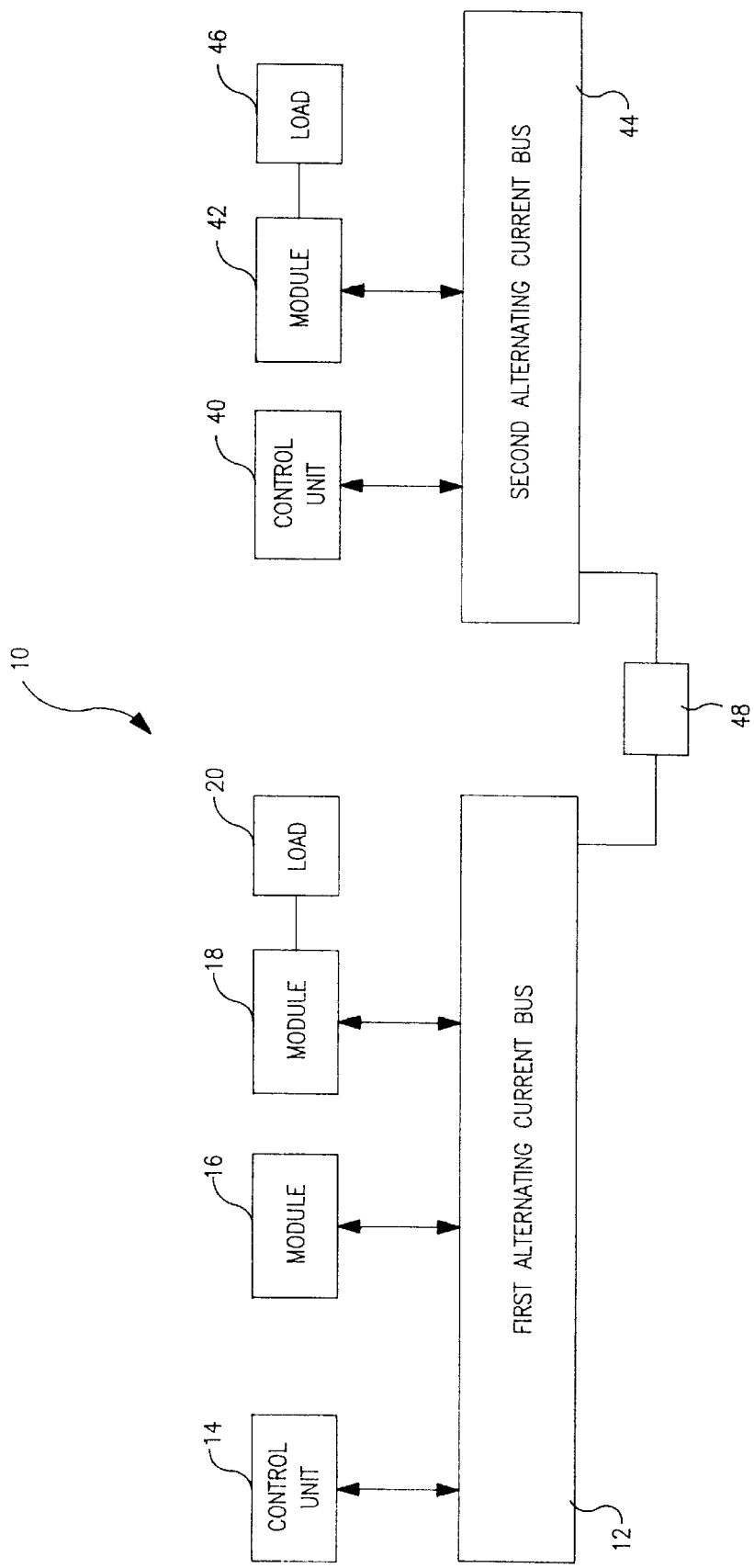
FIG. 1 is a block diagram of a monitoring and control apparatus constructed in accordance with the present invention for use with a power system having an alternating current bus.

FIG. 1 shows a block diagram of a monitoring and control apparatus 10 constructed in accordance with the present invention for a power system having an alternating current bus 12. Alternating current bus 12 includes at least one line, a neutral, and a ground. In one or more embodiments of the present invention, alternating current bus 12 may be a CEBus.

A control unit 14 is coupled to bus 12 as is module 16. Module 16 has circuitry for digitizing at least one of a voltage waveform or a current waveform on alternating current bus 12. These waveforms may be sinusoidal with a frequency of approximately 60 Hz. The digitized waveform may be modulated by module 16 onto a carrier and transmitted over bus 12. In one or more embodiments of apparatus 10, the carrier has a frequency of approximately 900 megahertz (MHz).

Control unit 14 receives the modulated and digitized waveform from module 16 via bus 12 and demodulates it to calculate one or more of the following: average current, root mean square current, peak current, current crest factor, average voltage, root mean square voltage, peak voltage, voltage crest factor, the shape of the current waveform, the shape of the voltage waveform, the harmonic structure of the current waveform, the harmonic structure of the voltage waveform, or the spike voltage. Subsequent to such calculation, one or more of these values may be displayed by control unit 14. Control unit 14 may be configured to control at least one of the following: the power supplied to a load at the module, activation/deactivation of the module, digitization of at least one of the voltage waveform and the current waveform, and transmission of the digitized waveform to control unit 14.

Apparatus 10 may further include a second module 18 that is coupled to bus 12. A load 20 is coupled to second module 18 so that power on bus 12 is transferred to load 20 via second module 18. Second module 18 may be programmed by control unit 14 to be responsive to a predetermined condition at first module 16. Module 18 may also be programmed to control power to load 20 independent of conditions at first module 16. Module 18 may further be configured to digitize and modulate either or both voltage or current waveforms on bus 12. Modules coupled to an alternating current bus may be programmed to have an identifier that allows each module coupled to the bus to recognize and communicate with other modules coupled to the bus.

Figure 2:
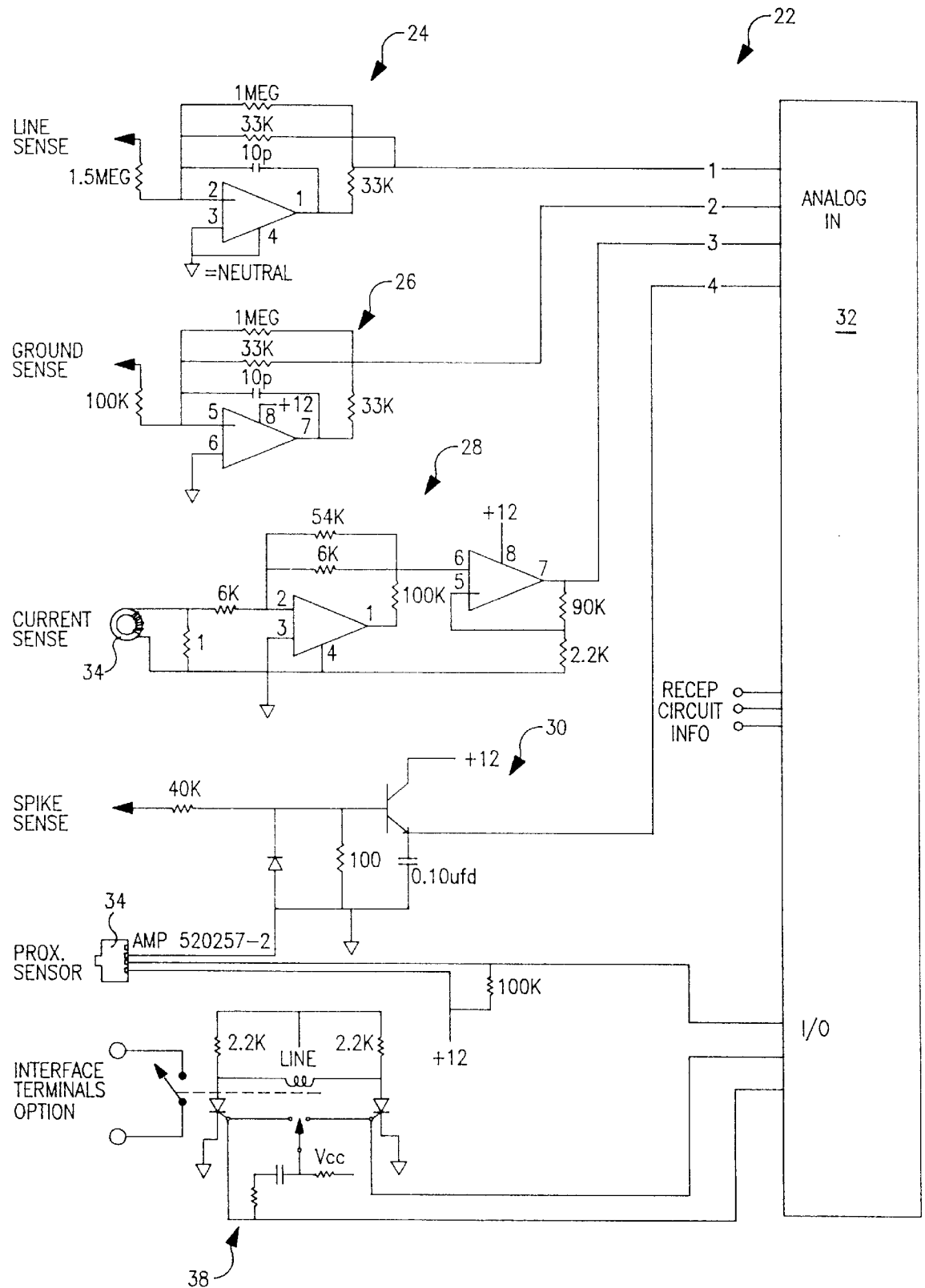
FIG. 2 is a schematic of a waveform sense circuit of the monitoring and control apparatus constructed in accordance with the present invention.

A schematic diagram of an embodiment of a waveform sense circuit 22 for monitoring and control apparatus 10 constructed in accordance with the present invention is shown in FIG. 2. Circuit 22 may be disposed in one or more of the modules of apparatus 10 and include a line sense circuit 24, a ground sense circuit 26, a current sense circuit 28 and a spike sense circuit 30. Line sense circuit 24 rectifies line waveforms and inputs them to processor 32 via pin 1 as shown. Ground sense circuit 26 rectifies neutral to ground voltage waveforms and applies teem to processor 32 via pin 2. Current sense circuit 28 includes a current transformer 34 and rectification circuitry that applies rectified current waveforms to processor 32 via pin 3. Spike sense circuit 30 measures a peak value of a voltage waveform and rectifies this waveform, prior to input into processor 32 via pin 4. Various values for the components of circuit 22 are shown in FIG. 2. However, it is to be understood that some or all of these values may be changed depending upon particular applications. Additionally, components may be added, replaced, or removed from circuit 22 depending upon particular applications.

As shown in FIG. 2, waveform sense circuit 22 may include a proximity sensor 36 coupled to an input/output (I/O) pin of processor 32. Waveform sense circuit 22 may additionally include an optional interface circuit 38 coupled to one or more input/output (I/O) pins of processor 32 as shown in FIG. 2.

Figure 3A:
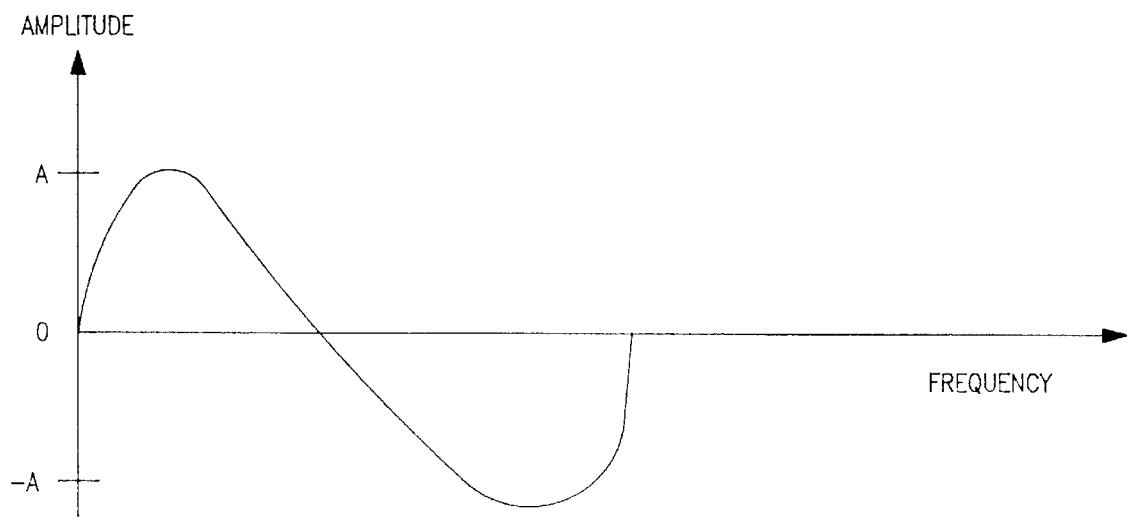
FIG. 3 is a diagram of the rectification performed by the waveform sense circuit of FIG. 2.
Figure 3B:
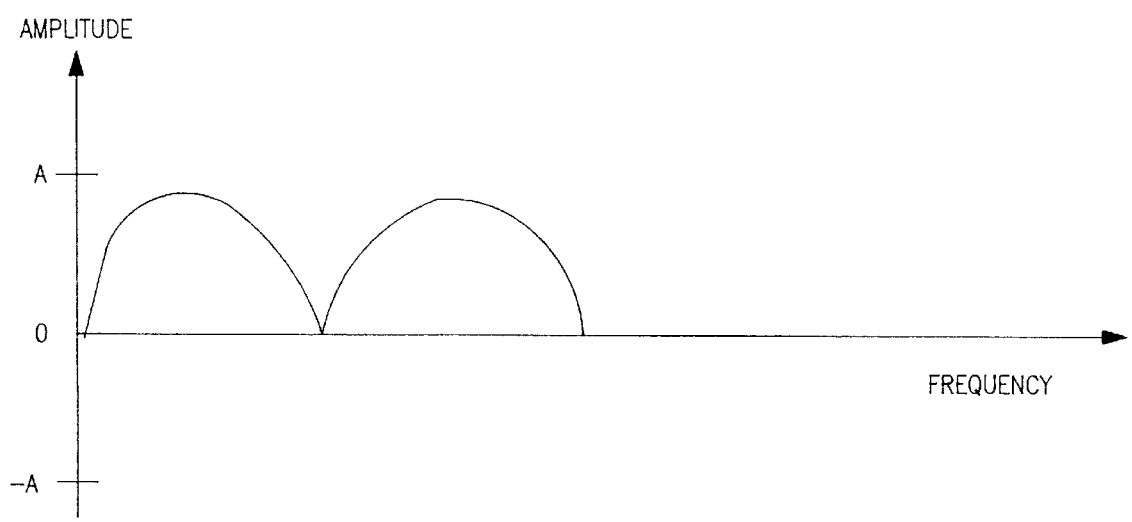

As discussed above, circuits 24, 26, 28, and 30 rectify waveforms on bus 12. An example of this rectification performed by these circuits is shown in FIG. 3. FIG. 3(a) represents one full cycle of a possible voltage or current waveform on bus 12. Circuits 24, 26, 28, and 30 perform a full-wave rectification of this waveform to produce the waveform shown in FIG. 3(b). Such full-wave rectification doubles the digitizing resolution for waveforms on bus 12 and also makes it unnecessary to keep track of waveform polarity, thereby adding an extra two bits for digitizing. Software operating in control unit 14 recognizes any zero crossings of waveforms on bus 12 as reversals in the polarity when interpreting digitized waveforms from modules 16 and 18.

In one or more embodiments of the present invention, control unit 14 may include a computer. Additionally, control unit 14 may include a transceiver and modules 16 and 18 may also include transceivers, each of which are configured to transmit and receive radio frequency signals.

Monitoring and control apparatus 10 may additionally include a second control unit 40 and a second module 42, each of which is coupled to a second alternating current bus 44. Alternating current bus 44 also includes at least one line, a neutral, and a ground. Control unit 40 may have some or all of the characteristics of control unit 14 described above and module 42 may have some of all of the characteristics of modules 16 and 18, also described above. Second module 42 digitizes either or both a voltage waveform or a current waveform on bus 44 and modulates that waveform onto a second carrier. This second carrier may also have a frequency of approximately 900 MHz. Control unit 40 demodulates this digitized waveform and calculates at least one of the parameters that may be calculated by control unit 14, as discussed above. A load 46 is coupled to module 42 and may be controlled thereby as discussed above in connection with second module 18 and load 20. Apparatus 10 may additionally include a modem 48 that connects buses 12 and 44 together. Modem 48 allows for two-way communication between control unit 14 and control unit 40 so that values measured on bus 44 can be accessed by control unit 14 and values measured on bus 12 can be accessed by control unit 40.

Figure 4A:
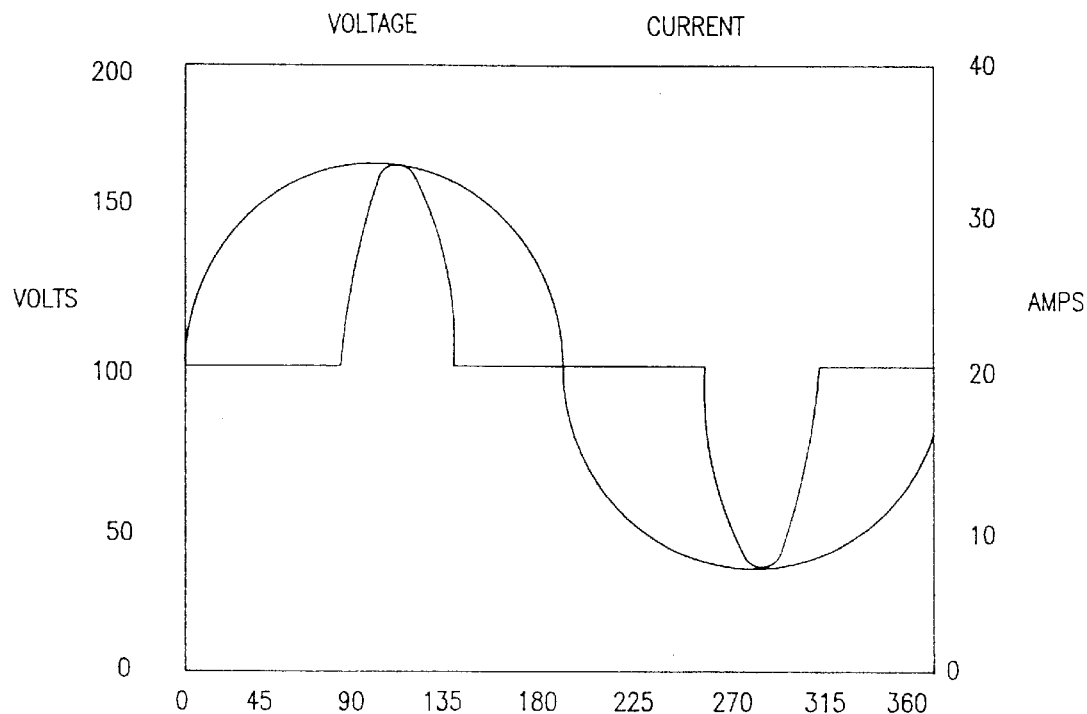
FIG. 4 is an exemplary data display for the monitoring and control apparatus of the present invention.
Figure 4B:
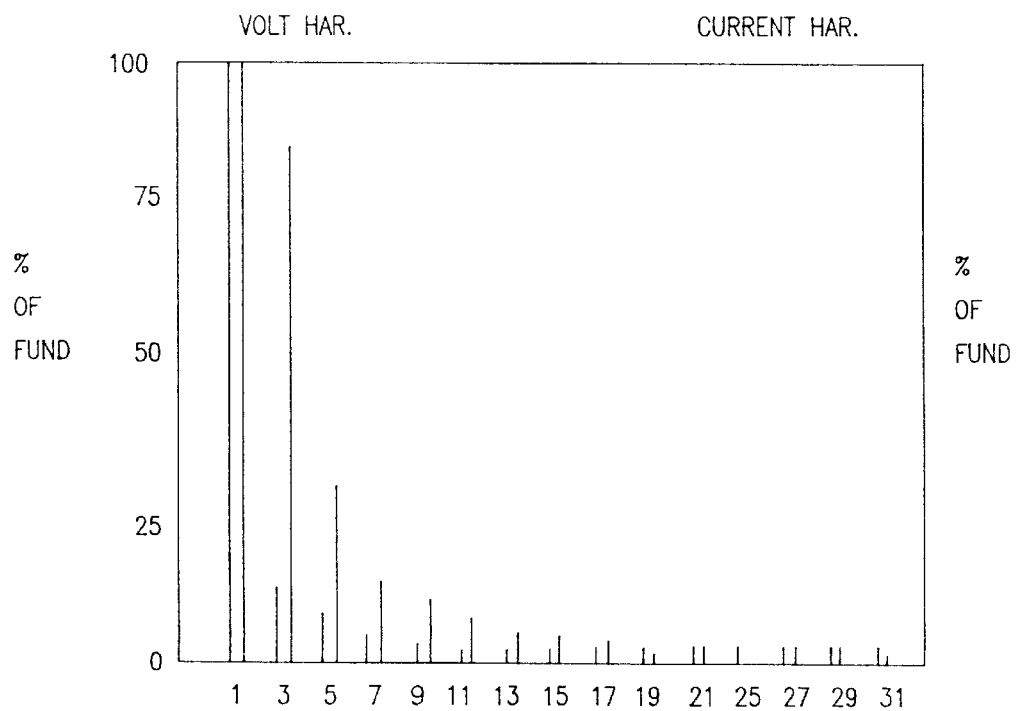
Figures 5A, 5B:
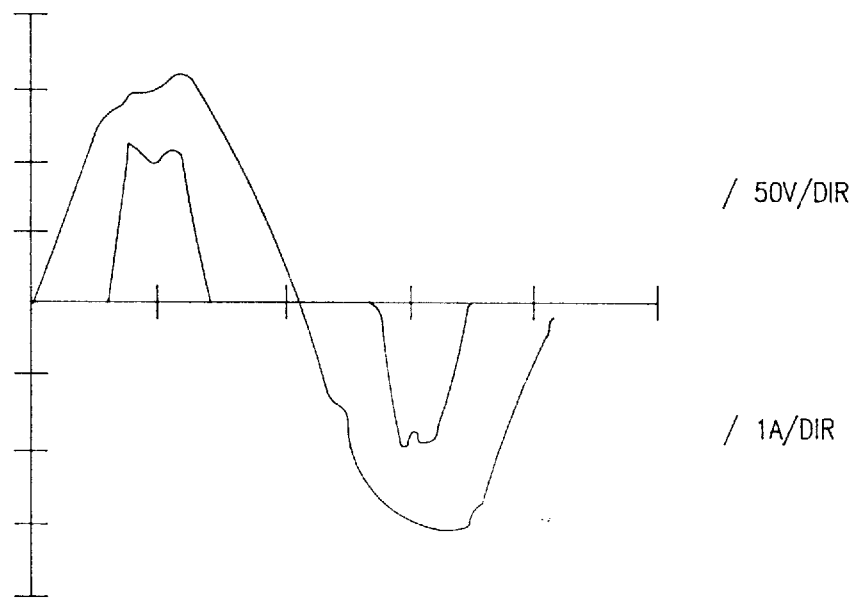
FIG. 5 is an alternative exemplary data display for the monitoring and control apparatus of the present invention.
Figure 5C:
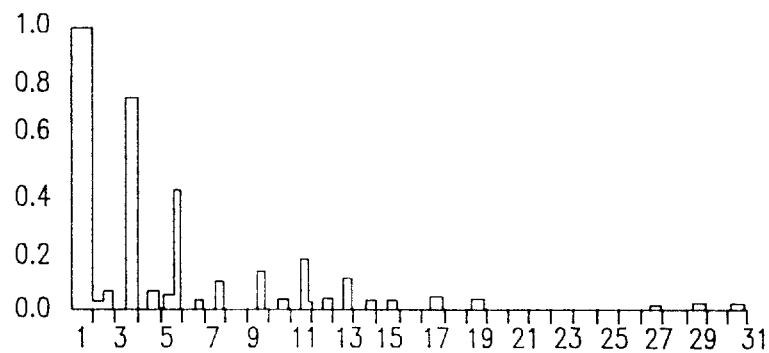
Figure 5D:
Figures 5E, 5F:
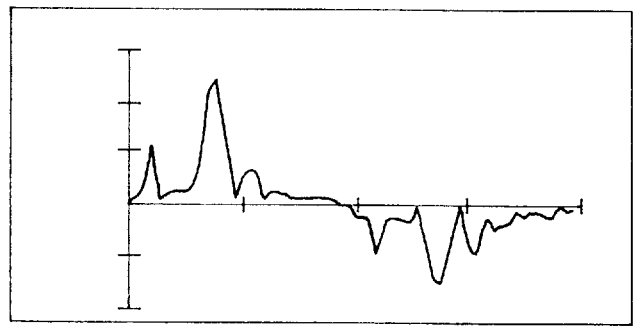

Control units 14 and 40 may be programmed to display one or more of the results calculated from information supplied by modules coupled to an alternating current bus. FIG. 4 illustrates a possible presentation of such calculated and measured values. The upper left quadrant of FIG. 4 displays instantaneous voltage and current waveforms on an alternating current bus. The lower left quadrant of FIG. 4 displays both voltage and current harmonic characteristics on the alternating current bus. The right half portion of FIG. 4 displays various current and voltage measurements on the alternating current bus, as well as a portion used to select features of system 10.

The upper left quadrant of FIG. 5 displays another representation of instantaneous voltage and current waveforms on an alternating current bus. The harmonic information for these waveforms, as well as their phase angles with respect to a fundamental frequency, are shown in the upper right quadrant of FIG. 5. The lower half of FIG. 5 represents various numerical measurements made for voltage and current waveforms on the alternating current bus, as well as a graphical representation of neutral-to-ground voltage.

Although particular graphical representations and numerical values are displayed in FIGS. 4 and 5, it is to be understood that units 14 and 40 may be programmed to display other values as well. Additionally, display formats other than those shown in FIG. 4 and 5 are possible. For example, units 14 and 40 may be programmed to display only graphical or, alternatively, numerical information.

From the preceding description of the preferred embodiments, it is evident that the objects of the invention are attained. Although the invention has been described and illustrated in detail, it is to be clearly understood that the same is intended by way of illustration and example only and is not to be taken by way of limitation. The spirit and scope of the invention are to be limited only by the terms of the appended claims.

What is claimed is:

1. An apparatus for monitoring a power system having an alternating current bus which includes at least one line, a neutral, and a ground, said apparatus comprising:

a module coupled to the bus for digitizing at least one of a voltage waveform and a current waveform present on the bus and modulating the digitized waveform onto a carrier; and means coupled to the bus for demodulating the digitized waveform and for calculating a parameter selected from the group consisting of average current, root mean square current, peak current, current crest factor, average voltage, root mean square voltage, peak voltage, voltage crest factor, voltage surge, current waveform shape, voltage waveform shape, current waveform harmonic structure, voltage waveform harmonic structure and combinations thereof.

2. The apparatus of claim 1, further comprising a second module coupled to the bus that is responsive to a predetermined condition at the first module.

3. The apparatus of claim 2, wherein the first module is programmable by the control unit to sense a condition at that module and direct the second module to respond as a result of that condition.

4. The apparatus of claim 2, wherein the control unit is configured to control at least one of the following: the power supplied to a load at one or more of the modules, activation/deactivation of one or more of the modules, digitization of at least one of the voltage waveform and the current waveform on the bus at one or more of the modules, and transmission of the digitized waveform to the control unit.

5. The apparatus of claim 2, wherein the modules each include a transceiver and the control unit includes a transceiver, each of which are configured to transmit and receive radio frequency signals.

6. The apparatus of claim 2, wherein each module is coupled to a load and is configurable to control at least one of a load voltage and a load current.

7. The apparatus of claim 1, wherein the module rectifies at least one of the voltage waveform and the current waveform before digitizing the waveform.

8. The apparatus of claim 7, wherein the module rectifies a full cycle of the waveform.

9. The apparatus of claim 1, wherein the control unit includes a computer.

10. The apparatus of claim 1, wherein the module includes a transceiver and the control unit includes a transceiver, each of which are configured to transmit and receive radio frequency signals.

11. The apparatus of claim 1, wherein the module is coupled to a load and is configurable to control at least one of a load voltage and a load current.

12. The apparatus of claim 1, further comprising:

a second module coupled to a second alternating current bus which includes at least one line, a neutral, and a ground, the second module digitizing at least one of a second voltage waveform and a second current waveform on the second bus and modulating the digitized waveform onto a second carrier; and a second control unit that demodulates the waveform digitized by the second module and calculates at least one of the following: average current, root mean square current, peak current, current crest factor, average voltage, root mean square voltage, peak voltage, voltage crest factor, voltage surge, current waveform shape, voltage waveform shape, current waveform harmonic structure, and voltage waveform harmonic structure.

13. The apparatus of claim 12, wherein the control units are in communication with one another whereby one or more waveforms digitized by the second module are received by either control unit.

14. The apparatus of claim 12, wherein at least one of the control units is configured to control at least one of the following: the power supplied to a load at each of the modules, activation/deactivation of the modules, digitization of at least one of the first voltage waveform and the first current waveform by the first module, digitization of at least one of the second voltage waveform and the second current waveform by the second module, and transmission of the digitized waveforms to the control unit.

15. A method of monitoring a power system having an alternating bus which includes at least one line, a neutral, and a ground, said method comprising the steps of:

rectifying at least one of a voltage waveform and a current waveform present on the bus;

digitizing the rectified waveform;

transmitting the digitized waveform to a control unit; and calculating a parameter selected from the group consisting of average current, root mean square current, peak current, current crest factor, average voltage, root mean square voltage, peak voltage, voltage crest factor, voltage surge, current waveform shape, voltage waveform shape, current waveform harmonic structure, voltage waveform harmonic structure, and combinations thereof.

16. The method of claim 15, further comprising the steps of:

programming a first module coupled to the bus to sense a predetermined condition at the first module; and controlling a second module coupled to the bus in response to the predetermined condition sensed at the first module.

17. The method of claim 15, further comprising the step of:

actuating a module coupled to the bus to control at least one of the following: the power supplied to a load coupled to the module, activation/deactivation of the module, digitization of at least one of the voltage waveform and the current waveform, and transmission to the control unit.

18. The method of claim 15, further comprising the step of displaying the calculation.

19. The method of claim 15, wherein the transmitting step includes the steps of:

modulating the digitized waveform onto a carrier; and demodulating the digitized waveform at the control unit.

20. The method of claim 15, further comprising the steps of:

programming a module coupled to the bus to sense a predetermined condition at the module; and controlling the module in response to the predetermined condition.

21. The method of claim 15, further comprising the step of:

programming each module coupled to the bus to have an identifier that allows each module coupled to the bus to recognize and communicate with other modules coupled to the bus.

22. The apparatus of claim 1, further comprising means coupled to the bus for controlling the power system, based upon the calculated parameter.

23. The apparatus of claim 22, wherein the means for demodulating the digitized waveform and for calculating a parameter, and the means for controlling the power system comprise a control unit.

24. The method of claim 15, further comprising controlling the power system, based upon the calculated parameter.

25. An apparatus for monitoring a power system having an alternating current bus which includes at least one line, a neutral, and a ground, said apparatus comprising:

a module coupled to the bus for digitizing at least one of a voltage waveform and a current waveform present on the bus at the module and modulating the digitized waveform onto a carrier; and means coupled to the bus for demodulating the digitized waveform and for calculating a power system parameter using the digitized waveform.

26. A method of monitoring a power system having an alternating bus which includes at least one line, a neutral, and a ground, said method comprising the steps of:

rectifying at least one of a voltage waveform and a current waveform present on the bus at a module;

digitizing the rectified waveform;

transmitting the digitized waveform to a control unit; and calculating a power system parameter by the control unit using the digitized waveform.

27. An apparatus for monitoring a power system having an alternating current bus which includes at least one line, a neutral, and a ground, said apparatus comprising:

a module coupled to the bus for digitizing a voltage waveform and a current waveform present on the bus at the module and modulating the digitized waveform onto a carrier in response to a control unit signal; and control unit coupled to the bus for transmitting the control unit signal and demodulating the digitized waveform.

28. The apparatus of claim 27, wherein the module digitizes a full cycle of the waveform.

* * * * *